United States Patent
Tsui et al.

(10) Patent No.: US 12,463,039 B2
(45) Date of Patent: Nov. 4, 2025

(54) METHOD FOR REDUCING PARASITIC JUNCTION FIELD EFFECT TRANSISTOR RESISTANCE

(71) Applicant: National Yang Ming Chiao Tung University, Hsinchu (TW)

(72) Inventors: Bing-Yue Tsui, Hsinchu (TW); Jui-Cheng Wang, Hsinchu (TW)

(73) Assignee: NATIONAL YANG MING CHIAO TUNG UNIVERSITY, Hsinchu (TW)

( * ) Notice: Subject to any disclaimer, the term of this patent is extended or adjusted under 35 U.S.C. 154(b) by 602 days.

(21) Appl. No.: 17/878,575

(22) Filed: Aug. 1, 2022

(65) Prior Publication Data

US 2023/0360916 A1     Nov. 9, 2023

(30) Foreign Application Priority Data

May 6, 2022    (TW) .................................. 111117126

(51) Int. Cl.
    *H01L 21/266*     (2006.01)
    *H10D 12/00*     (2025.01)
    *H10D 30/66*     (2025.01)

(52) U.S. Cl.
    CPC ......... *H01L 21/266* (2013.01); *H10D 12/441* (2025.01); *H10D 30/66* (2025.01)

(58) Field of Classification Search
None
See application file for complete search history.

(56) References Cited

U.S. PATENT DOCUMENTS

| | | | | |
|---|---|---|---|---|
| 3,496,426 A | * | 2/1970 | Kaiser ................... | H10D 99/00 |
| | | | | 257/653 |
| 4,906,587 A | * | 3/1990 | Blake ................... | H10D 62/126 |
| | | | | 257/E29.026 |

(Continued)

OTHER PUBLICATIONS

Howell et al., "A 10-KV Large-Area 4H-SiC Power DMOSFET With Stable Subthreshold Behavior Independent of Temperature", IEEE Transactions on Electron Devices, vol. 55, No. 8, Aug. 2008, pp. 1807-1815.

(Continued)

*Primary Examiner* — Sarah K Salerno
(74) *Attorney, Agent, or Firm* — Birch, Stewart, Kolasch & Birch, LLP

(57) ABSTRACT

A method for reducing parasitic junction field effect transistor resistance, applicable to a high power device having a semiconductor substrate layer, is provided, including providing a plurality of hard masks on a top surface of the semiconductor substrate layer. Each hard mask has a bottom plane and a tilt sidewall such that an acute angle is formed there in between. A body ion implantation process is subsequently performed, so a body region is formed between two adjacent hard masks. The body region has an upper and a lower surface. A width of the upper surface is greater than that of the lower surface. Therefore, the present invention achieves to control a parasitic JFET region characterized by having a wider bottom and a narrower top, thereby reducing its resistance thereof. Meanwhile, since a bottom angle of the body region is increased, breakdown voltage of the device is increased as well.

16 Claims, 18 Drawing Sheets
(6 of 18 Drawing Sheet(s) Filed in Color)

(56) References Cited

U.S. PATENT DOCUMENTS

| | | | | |
|---|---|---|---|---|
| 5,831,313 | A * | 11/1998 | Han | H01L 21/76218 |
| | | | | 257/E21.558 |
| 6,015,991 | A * | 1/2000 | Wheeler | H10D 30/0221 |
| | | | | 257/E29.268 |
| 7,923,320 | B2 | 4/2011 | Ryu | |
| 9,768,259 | B2 | 9/2017 | Suvorov et al. | |
| 11,031,461 | B2 | 6/2021 | Sundaresan et al. | |
| 11,152,504 | B2 | 10/2021 | Reghunathan et al. | |
| 2014/0252456 | A1 | 9/2014 | Liao | |
| 2015/0084060 | A1 * | 3/2015 | Huang | H10D 64/411 |
| | | | | 438/134 |
| 2020/0181444 | A1 * | 6/2020 | Fishel | C09D 135/02 |

OTHER PUBLICATIONS

Jang et al. "Improved on-state resistance with reliable reverse characteristics in 1.2 kV 4H-SiC MOSFET by selective nitrogen implantation assisted current spreading layer", Japanese Journal of Applied Physics vol. 59, 2020, p. 046501.

* cited by examiner

METHOD FOR REDUCING PARASITIC JUNCTION FIELD EFFECT TRANSISTOR RESISTANCE

This application claims priority of Application No. 111117126 filed in Taiwan on 6 May 2022 under 35 U.S.C. § 119; the entire contents of all of which are hereby incorporated by reference.

BACKGROUND OF THE INVENTION

Field of the Invention

The present invention is related to a process technique for reducing parasitic junction field effect transistor resistance. More particularly, it is related to a process method which is aimed to form a semiconductor body region having a tilt edge connected between its wider top and narrower bottom by using at least one ion implantation hard mask having tilt sidewalls, such that resistances of its parasitic junction field effect transistor formed therein between can be effectively reduced.

Description of the Prior Art

In general, high power devices have been widely used in various power electronics fields, including: switching elements, motor control, consumer electronics, uninterruptible power systems and so on, due to features of low power consumption, high voltage endurance, rapid switching speed, and safe operating range. Since the applications of power integrated circuits and components in the electrical and related electronic fields are gradually increasing, and the design, manufacture and working conditions of the high power devices are distinct from those of general low power devices, when considering design processes of high power devices, it is usually necessary to give priority to the voltage and current range that the device can withstand, as well as power, usage durability, and reliability, etc. of the device.

Please refer to FIG. 1, which shows a schematic structural diagram of a traditional Vertical Double Diffused Metal Oxide Semiconductor Field Effect Transistor (VDMOSFET) in the prior art. In such a conventional VDMOSFET, it comprises an N-type semiconductor substrate 102, an N-type drift region 104, N-type heavily doped regions (N+) 121, 122, P-type heavily doped regions (P+) 131, 132, P-type body regions (P-body, or P-base) 161, 162, a drain terminal 100, a gate terminal 201, and a source terminal 203. In general, whether a silicon or silicon carbide material is used, it has been verified as one of the most matured options for implementing high power MOSFETs. Its advantages include that process methods are nearly the same as those of conventional low voltage MOSFETs. In addition, the device reliability and breakdown mechanism are also similar to those in the conventional low voltage MOSFETs due to its planar channel. However, the VDMOSFET still has two main disadvantages: the first is that, the VDMOSFET has a relatively larger cell pitch when compared with the trench gate MOSFET. Secondly, please refer to FIG. 1, in which a junction field effect transistor (JFET) region 106 is formed between the adjacent P-body 161 and 162 and thereby the common junction field effect transistor effect (JFET effect) is induced. Due to these two said factors, the specific on-resistance ($R_{on, sp}$) of the device will inevitably increase significantly.

As known, the current methodologies for reducing the effect of the junction field effect transistor in the prior arts include: increasing the dopant concentration of the JFET region or increasing the width of the JFET region. However, increasing the width of the JFET region will accordingly increase the cell pitch of the device at the same time, which is harmful to the specific on-resistance. Therefore, another option is to adjust the dopant concentration of the JFET region, and further dispose a current spreading layer (CSL) under the P-body. However, it is still worth noting that these current methodologies still have their tradeoffs, including increasing the dopant concentration of the JFET region or disposing the current spreading layer reduce the breakdown voltage of the device. In addition, a drain-to-body capacitance ($C_{DB}$), also known as the output capacitance will be increased as well. And therefore, these are still the shortcomings that the current methodologies yet, need to face and solve.

Besides, it is also known that the above-mentioned P-body region is usually fabricated by using ion implantation, and the depth of the body region is usually designed to be about 1 micron. Since most of the dopants hardly diffuse in the silicon carbide substrate, the energy for the ion implantation must be increased when a deeper depth is expected. And as the energy for the ion implantation is increased, it induces more lateral straggle. As a result, in practical, a P-body is more likely to have a protruding edge 211 extending toward the JFET region, as shown in FIG. 2 instead of having a straight vertical edge 111 as shown in FIG. 1. And because of such protruding edges of the P-body, it makes the JFET region 106 narrower, thereby causing the JFET effect much more severely. In order to improve these defects, according to the development trends of the prior art, the existing improvement methods mostly focus on adjusting the dopant concentration of the JFET region itself, or disposing an additional current spreading layer. However, it should be noticed that these methods not only require additional process steps, increase the process complexity, which fail to reduce the process cost, but also have unavoidable negative effects thereof.

Therefore, on account of above, to overcome the above-mentioned issues, it should be apparent that there is indeed an urgent need for the professionals in the field for a new and novel process method to be developed, that can effectively reduce the current JFET effect as well as increase breakdown voltages of the device. Moreover, the proposed process method of the present invention can be also compatible with the existing methodology in the prior design. The detailed specific descriptions and implementations will be provided by Applicants of the present invention in the following paragraphs as below.

SUMMARY OF THE INVENTION

In order to overcome the above-mentioned disadvantages, one major objective in accordance with the present invention is provided for a novel process technology, which is applicable to reducing the known JFET effect. According to the disclosed process techniques of the present invention, it mainly adopts a barrier structure having tilt sidewalls as the hard mask for body ion implantation such that a body region having a tilt edge can be formed after the body ion implantation. As a result, a parasitic JFET region characterized by having a wider bottom and a narrower top can be obtained accordingly, thereby reducing its parasitic JFET resistance thereof.

Meanwhile, since a bottom angle of the body region is increased, breakdown voltage of the device is increased as well. In addition, according to the disclosed process method of the present invention, its application field is not limited to the current silicon (Si) and silicon carbide (SiC) substrates. Based on the same principles, the disclosed process method may also be applied to substrates made of other semiconductor materials having wide energy bandgaps, such as gallium oxide ($Ga_2O_3$), aluminum nitride (AlN), and diamond, etc. Furthermore, according to the disclosed method for reducing the parasitic JFET resistance, it can be applied to high power devices, including: a Vertical Double Diffused Metal Oxide Semiconductor Field Effect Transistor (VDMOSFET), and an Insulated Gate Bipolar Transistor (IGBT). To sum up, for those who are skilled in the art and having ordinary knowledge, appropriate modifications or changes based on the technical solutions disclosed in the present invention without departing from the spirit of the present invention are practicable. However, the modifications should still fall into the scope of the present invention. The present invention is certainly not limited thereto the disclosed parameters, conditions, as well as fields of the application.

According to the novel process techniques provided by Applicants of the present invention, it is aimed to disclose a process method for a high power device. The high power device includes a semiconductor substrate layer. The disclosed method is applicable to reducing parasitic junction field effect transistor resistance of the high power device.

The disclosed method for reducing parasitic junction field effect transistor resistance comprises a plurality of following steps:

(a): providing a plurality of hard masks on a top surface of the semiconductor substrate layer, wherein each of the plurality of hard masks includes a bottom plane and a tilt sidewall, and an acute angle is formed between the tilt sidewall and the bottom plane.

In one embodiment of the present invention, the formed acute angle is preferably between 30 degrees and 85 degrees.

(b): Subsequently, performing a body ion implantation process, such that at least one body region is formed between adjacent two of the plurality of hard masks in the semiconductor substrate layer. Wherein, the body region has an upper surface and a lower surface, and a width of the upper surface is greater than that of the lower surface.

According to the proposed process techniques of the present invention, regarding the body ion implantation process, the ions used in the body ion implantation process, including the ion species, implantation energies, implantation dosages, as well as parameters such as temperature and time for performing the process, are allowed to be adjustable. Therefore, it is believed that the present invention is characterized by having superior process flexibility. For one illustrative embodiment of the present invention, an ion implantation dose of the body ion implantation process for instance, can be between $10^{12}$ $cm^{-2}$ and $10^{14}$ $cm^{-2}$. And, an ion implantation energy of the body ion implantation process is between 10 keV and 2 MeV.

According to the technical contents of the present invention, when there are at least two body regions formed in the semiconductor substrate layer of the high power device, so that a parasitic junction field effect transistor (JFET) region is formed between the two body regions, the parasitic junction field effect transistor region has an upper width and a lower width, and the lower width is greater than the upper width. Therefore, the present invention achieves to control the parasitic junction field effect transistor region characterized by having a wider bottom and a narrower top.

By effectively forming the parasitic JFET region having a wider bottom and a narrower top, the present invention successfully suppresses the conventional JFET effect. In addition, due to an increased bottom angle is provided on account of the specific outline shape of the body region, breakdown voltage of the high power device can be further increased as well.

According to one embodiment of the present invention, the foregoing plurality of hard masks can be formed by applying a lithography process to a barrier layer. And the barrier layer, for example, can be made of silicon dioxide, silicon nitride, or polysilicon. In one variant embodiment, a thickness of the barrier layer is between 0.5 µm and 3 µm.

And furthermore, as above-mentioned, after the body region is formed, the present invention may further proceed to the following process steps, including removing the plurality of hard masks, and growing a field oxide layer. Later, a lithography process is applied to the field oxide layer to define a gate region. And a gate oxide layer is formed in the gate region. A gate conductive layer is then formed on the gate oxide layer, and a dielectric layer is further deposited on the gate conductive layer. At least one contact window which extends through the dielectric layer is subsequently provided and being electrically connected to the semiconductor substrate layer of the high power device for providing electrical paths.

Among them, according to one embodiment of the present invention, regarding forming the gate conductive layer, it is feasible to use a low-pressure chemical vapor deposition (LPCVD) process to deposit polysilicon as a gate material first. After that, an etch back process is employed to etch back the polysilicon, such that the gate conductive layer can be formed.

Therefore, it is believed that the present invention discloses a method for reducing parasitic junction field effect transistor resistance, and based on such process method, it can be effectively and widely applied to any power devices having a VDMOSFET structure, such that the power device's specific on-resistance ($R_{on, sp}$) can be reduced, and breakdown voltages are increased. It is believed that the present invention is advantageous of having great technical compatibilities and comply with the existing technologies, whereby full of industrial application values.

It should be noted that the embodiments disclosed in the present invention are described by illustrating silicon carbide as an exemplary example. It is merely intended to enable those skilled in the art to fully understand the technical solution of the present invention, but not to limit the scope and/or application of the present invention. In other words, according to the process method disclosed hereby the present invention, it is applicable to more than a silicon carbide substrate, but also to a variety of substrates made of various semiconductor materials.

Below, the embodiments are described in detail in cooperation with the drawings, so that these and other objectives of the present invention will become obvious to those of ordinary skill in the art after reading the following detailed description of preferred embodiments. And technical contents, characteristics and accomplishments of the invention are easily comprehensive.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
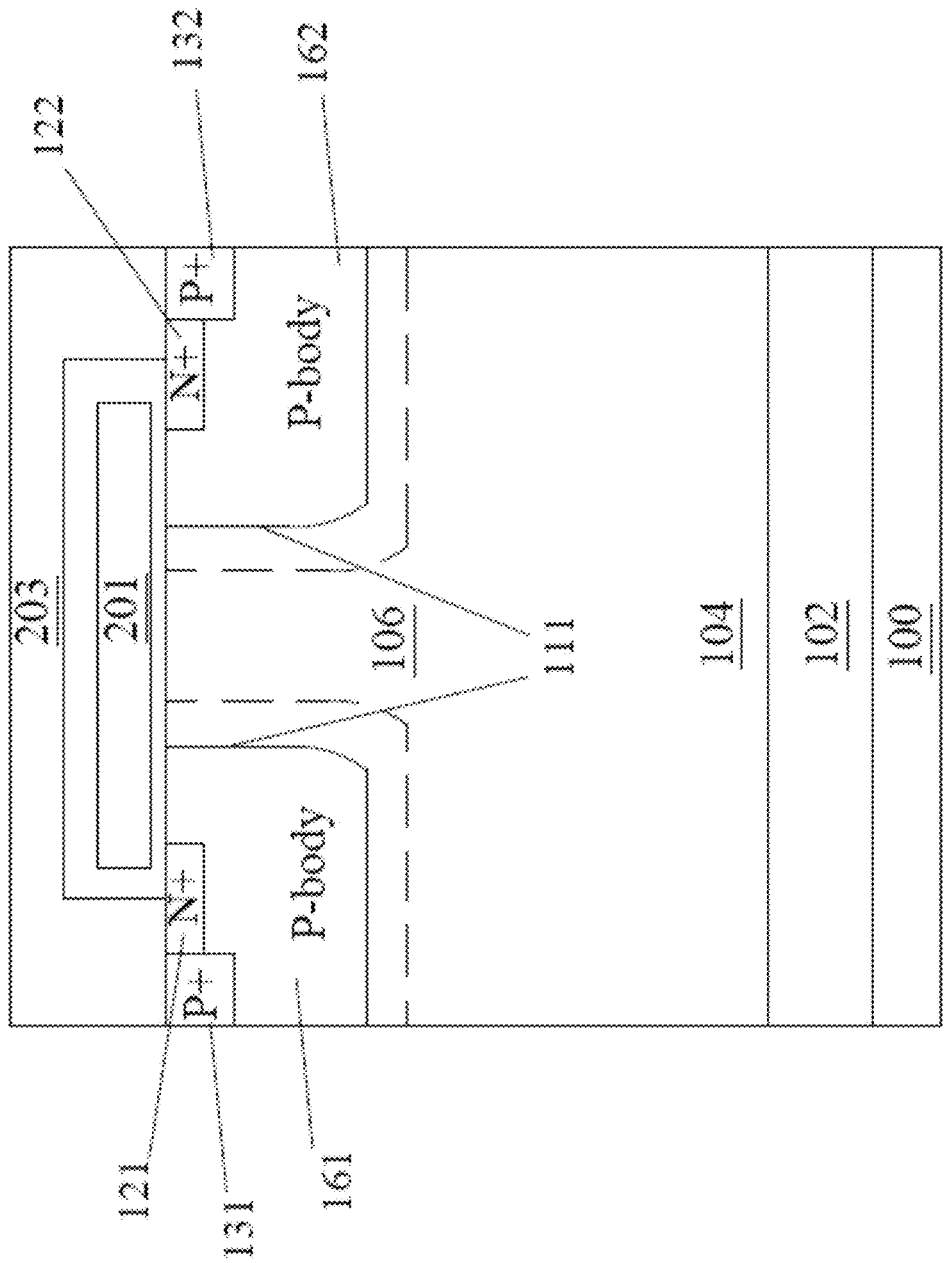
FIG. 1 shows a schematic structural diagram of a traditional Vertical Double Diffused Metal Oxide Semiconductor Field Effect Transistor (VDMOSFET) having a straight and vertical edge in the prior art.
Figure 2:
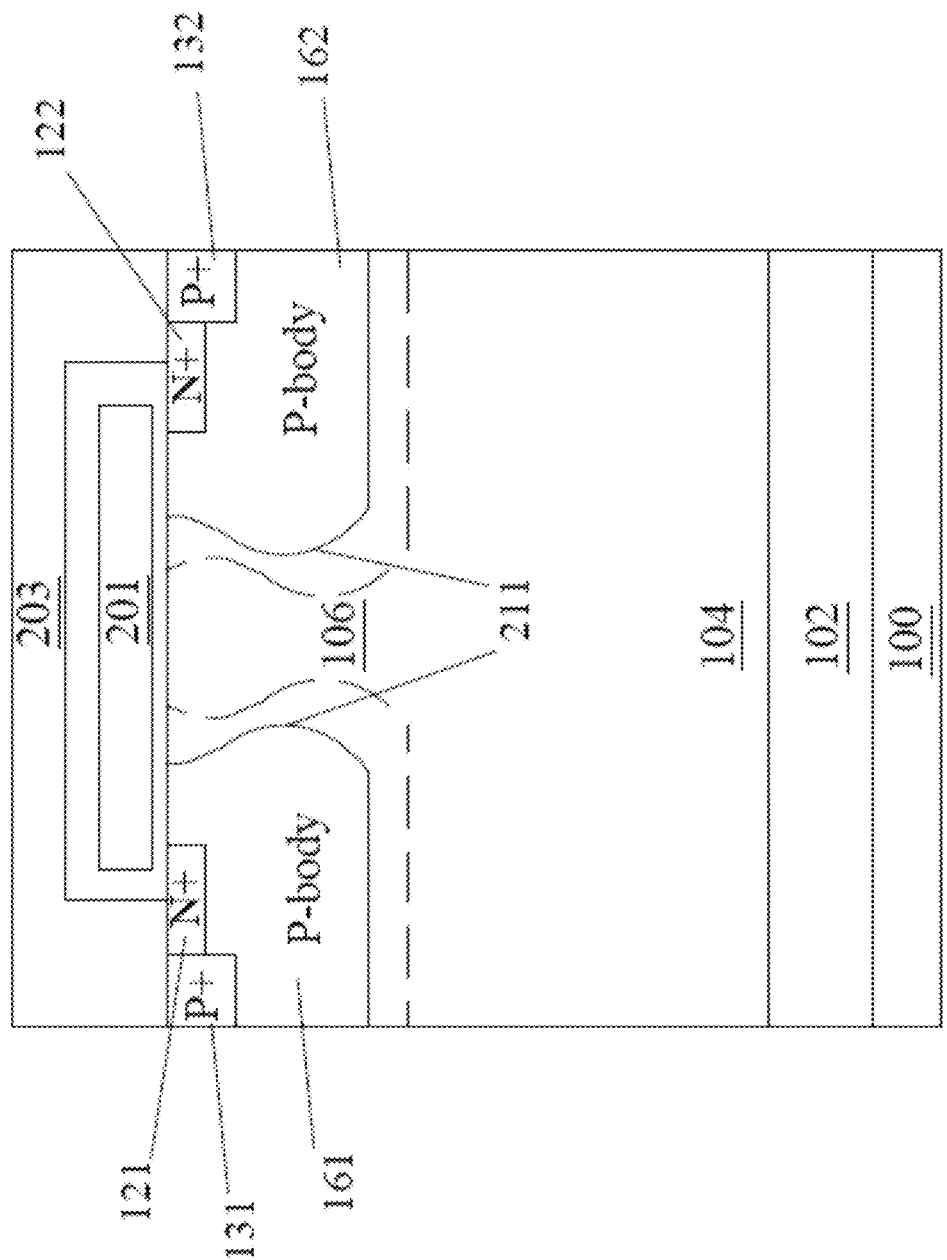
FIG. 2 shows a schematic structural diagram of a traditional Vertical Double Diffused Metal Oxide Semiconductor Field Effect Transistor (VDMOSFET) having a protruding edge in the prior art.

It is to be understood that both the foregoing general description and the following detailed description are exemplary and are intended to provide further explanation of the invention as claimed.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 3A:
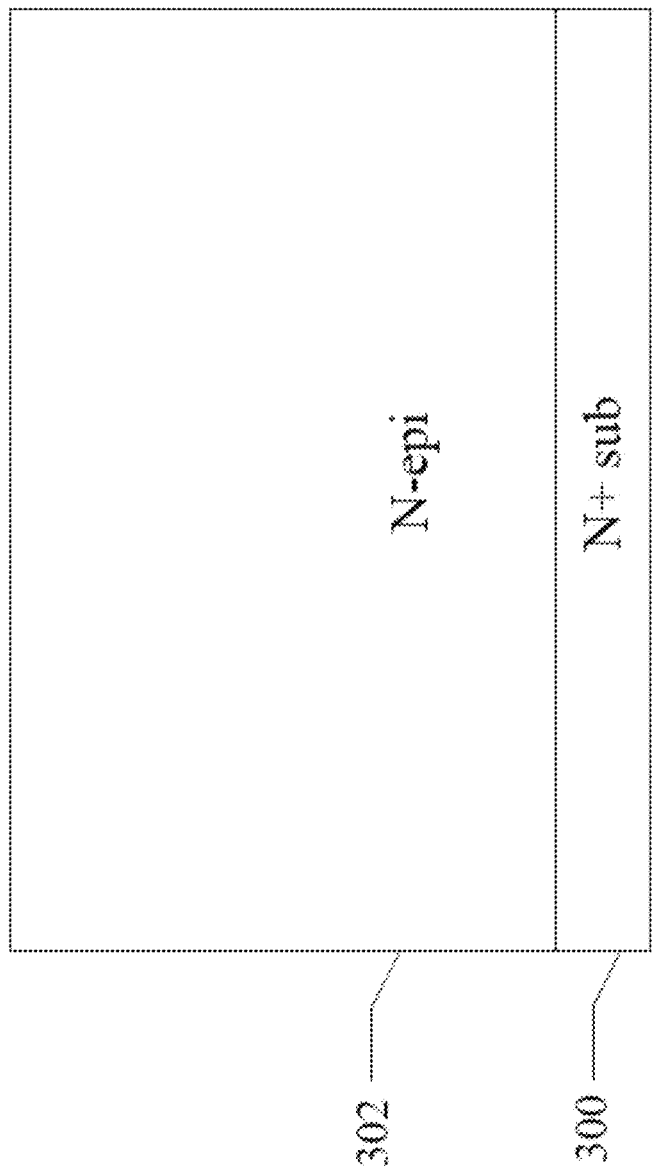
FIG. 3A shows a schematic structural diagram of forming an N-type epitaxial layer on an N-type semiconductor substrate in accordance with one embodiment of the present invention.

The present invention discloses a method for reducing parasitic junction field effect transistor (JFET) resistance. Please refer to FIG. 3A to FIG. 3I, which accompanying show schematic cross-sectional views of the structure of a high power device by employing the proposed method disclosed in the present invention. According to the present invention, the high power device includes a semiconductor substrate layer, which is made of a semiconductor material. The semiconductor material for example, can be silicon, or a semiconductor material having a wide bandgap, such as silicon carbide (SiC), gallium oxide ($Ga_2O_3$), aluminum nitride (AlN), and diamond, etc. First, please refer to FIG. 3A, wherein an N-type semiconductor substrate (shown as N+ sub) 300 is provided, and an N-type epitaxial layer (shown as N-epi) 302 is formed on the N-type semiconductor substrate 300. In such step, according to one preferred embodiment of the present invention, the N-type semiconductor substrate (N+ sub) 300 preferably, is an N-type silicon carbide (SiC) substrate. And, an N-type SiC epitaxial layer with a doping concentration of $1 \times 10^{16}$ $cm^{-3}$ and a thickness of 5.5 µm is grown on the front side of the substrate 300 as the N-type epitaxial layer (N-epi) 302 by epitaxial growth, so as to form the structure as shown in FIG. 3A. Hereinafter, it is worth noting that the substrate material is not limited to N-type silicon carbide. In alternative embodiments of the present invention, alternative semiconductor materials, having the wide bandgap such as: gallium oxide ($Ga_2O_3$), aluminum nitride (AlN), and diamond, or silicon material are also feasible for fabrication of the substrate of the present invention. In the following descriptions, the Applicants merely take the substrate made of N-type silicon carbide as an illustrative example for introducing the technical features of the present invention. In the same manners, those skilled in the art are acknowledged to apply the disclosed method in the present invention to the device having a P-type semiconductor substrate on account of teachings from the present invention. Similar descriptions are thus omitted in the present invention.

Figure 3B:
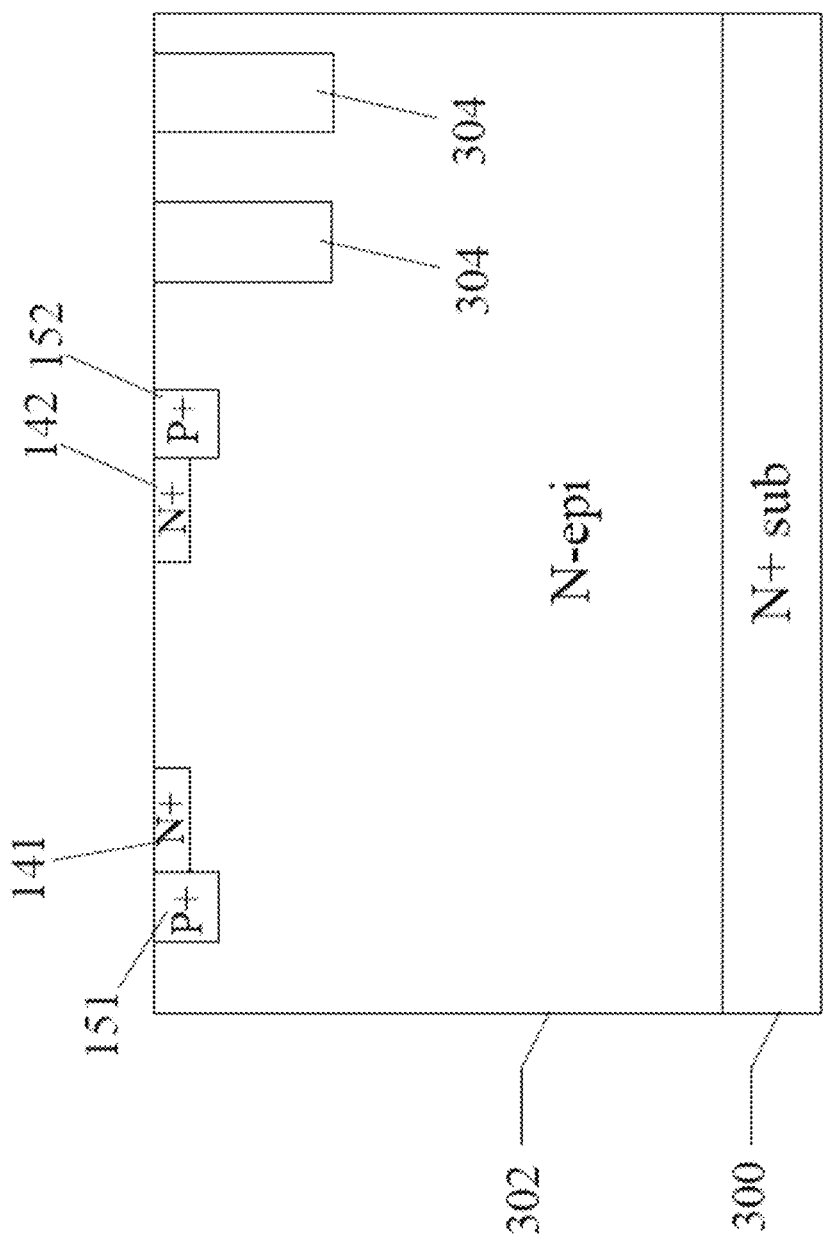
FIG. 3B shows a schematic structural diagram from FIG. 3A after the source ion implantation, definition and ion implantations of the P-type heavily doped regions and floating guard ring regions.

Next, after RCA cleaning, silicon dioxide is deposited as a hard mask, and a lithography process is employed to define an N+ source window. According to the embodiment of the present invention as shown in FIG. 3B, a first N-type heavily doped region (N+) 141 and a second N-type heavily doped region (N+) 142 are formed by using a source ion implantation in the N-type epitaxial layer 302. Subsequently, after the source ion implantation, the hard mask is removed, and the RCA cleaning is performed repeatedly. After that, the P-type heavily doped regions are defined and ion implantations are carried out, so that a first P-type heavily doped region (P+) 151 and a second P-type heavily doped region (P+) 152 are formed as illustrated in FIG. 3B.

In such a structure, as shown in FIG. 3B, the N-type epitaxial layer 302 is formed on the N-type semiconductor substrate 300. The first P-type heavily doped region 151 is disposed adjacent to the first N-type heavily doped region 141, and the first P-type heavily doped region 151 and the first N-type heavily doped region 141 are commonly disposed in the N-type epitaxial layer 302. The second P-type heavily doped region 152 is disposed adjacent to the second N-type heavily doped region 142, and the second P-type heavily doped region 152 and the second N-type heavily doped region 142 are commonly disposed in the N-type epitaxial layer 302. And then, silicon dioxide is used again as a hard mask and a lithography process is employed to define the floating guard ring window for floating guard ring ion implantation. Later on, the hard mask is removed, such that at least one floating guard ring 304 is formed at a termination of the high power device. According to the embodiment of the present invention, the floating guard rings 304 can be formed at a termination outside the first P-type heavily doped region 151 or the second P-type heavily doped region 152 by employing the aforementioned floating guard ring window definition and ion implantation to provide voltage endurance protection. Hereinafter, the semiconductor substrate layer of the applied high power device (N-channel VDMOSFET) in the embodiment is formed. However, the high power devices in which the present invention can be applied are not limited to such an N-channel VDMOSFET. Any other P-channel high power devices, or high power device having a VDMOSFET structure whether a N-channel or P-channel is used therein, such as Insulated Gate Bipolar Transistor (IGBT) are also implementable. According to the disclosed method in the present invention, in this embodiment of the present invention, an N-channel VDMOSFET is simply taken as an explanatory one for describing the technical contents of the invention, and yet is not intended to limit the scope of the present invention. The above-mentioned process flows as illustrated in FIG. 3A and FIG. 3B are the standard processes of forming a VDMOSFET. In the following, the innovative process flows of the present invention will be described in details for references.

Figure 3C:
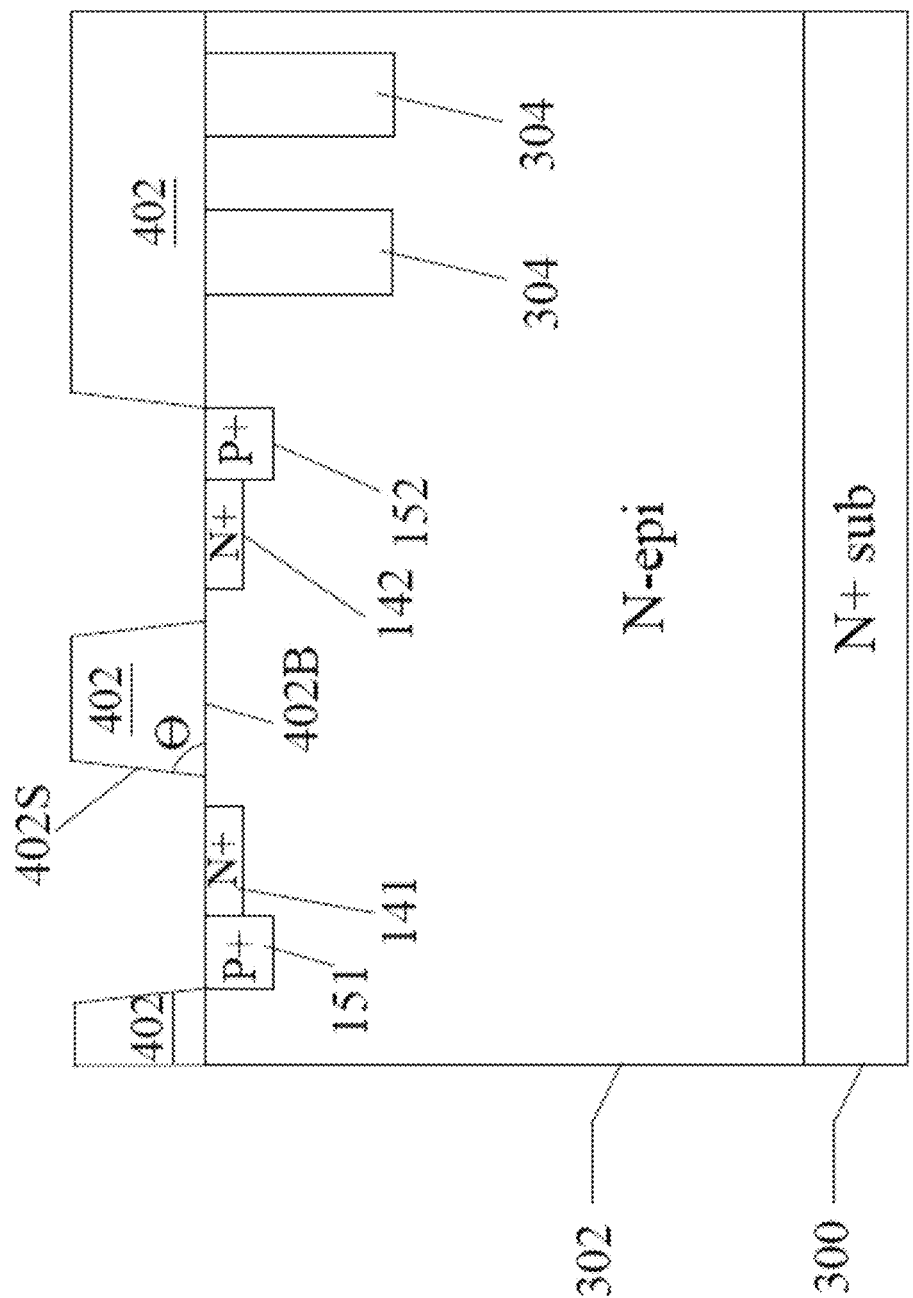
FIG. 3C shows a schematic structural diagram from FIG. 3B after a plurality of hard masks are provided on a top surface of the semiconductor substrate layer.
Figure 3D:
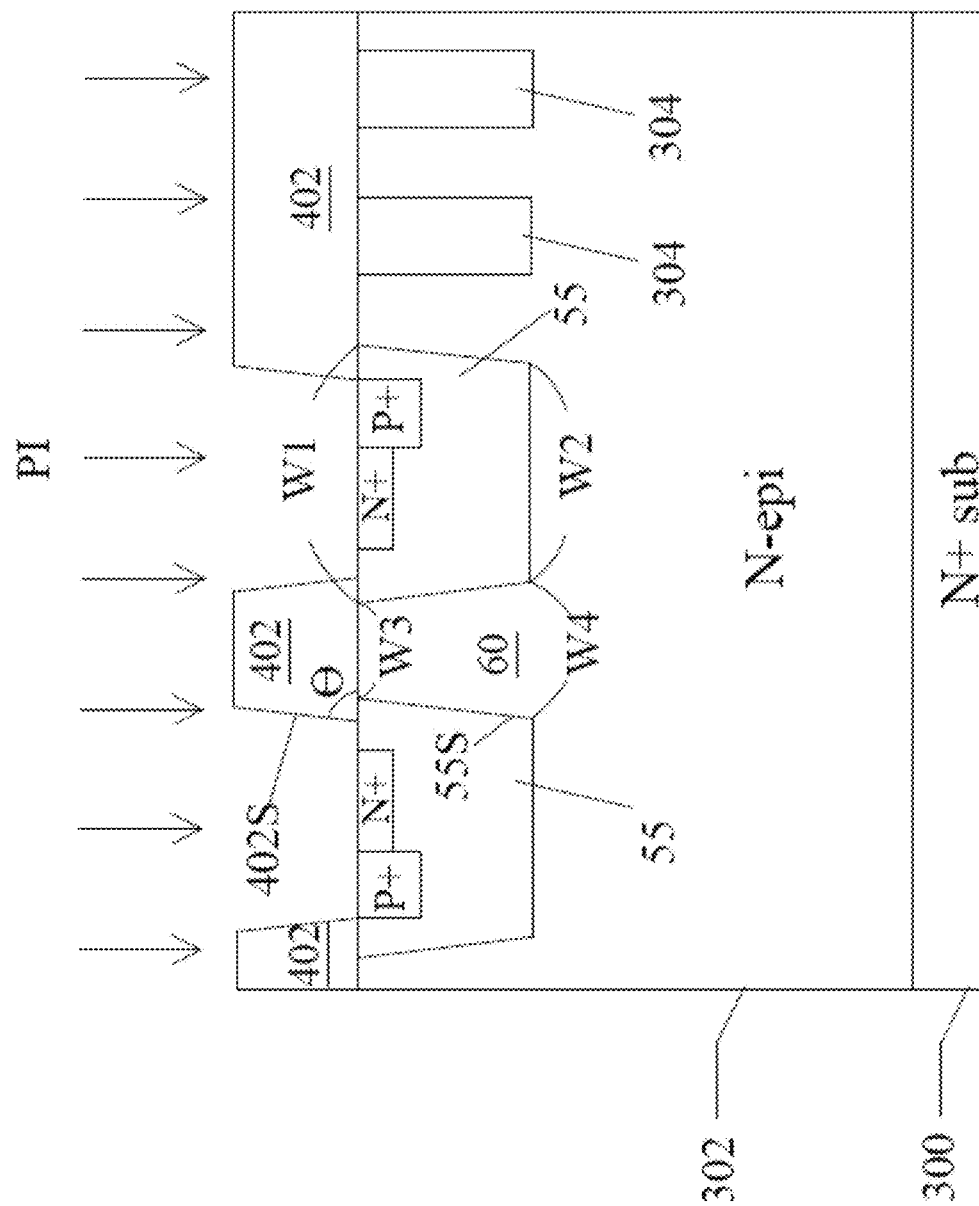
FIG. 3D shows a schematic structural diagram from FIG. 3C after a body ion implantation process is performed.
Figure 4:
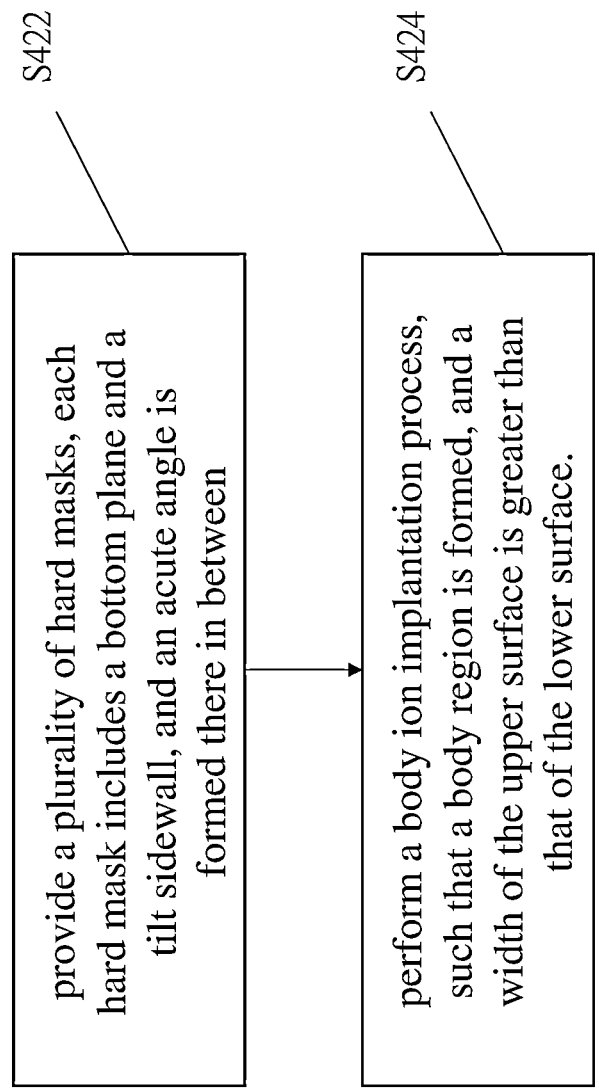
FIG. 4 shows a process flow chart illustrating the steps of the proposed method for reducing parasitic junction field effect transistor resistance in accordance with the embodiment of the present invention.

Please refer to FIG. 3C for the schematic structural diagram along with the process flows in FIG. 4 illustrating the steps S422 and S424 of the proposed method for reducing parasitic junction field effect transistor resistance of the present invention. As mentioned above, after completing the standard processes of forming the VDMOSFET (as shown in FIG. 3B), the present invention proceeds to perform the step S422 to provide a plurality of hard masks 402 on a top surface of the semiconductor substrate layer of the high power device. As shown in FIG. 3C, each hard mask 402 includes a bottom plane 402B and a tilt sidewall 402S, such that an acute angle θ is formed between the tilt sidewall 402S and the bottom plane 402B.

According to a preferred embodiment of the present invention, these hard masks 402 can be formed by applying a lithography process to a barrier layer, such that the hard masks 402 are designed to have specific shapes, that are, the tilt sidewall 402S, the bottom plane 402B, and the acute angle θ formed there in between. According to one embodiment of the present invention, the barrier layer can be, for instance, made of silicon dioxide, silicon nitride, or polysilicon. A thickness of the barrier layer can be, for example, between 0.5 μm and 3 μm. In the embodiment as shown in FIG. 3C, the applicants of the present invention merely use the hard mask 402 formed as a trapezoid as a certain implementation to explain the technical contents of the present invention. However, according to other implementation forms of the present invention, the hard mask 402 can also be formed as a triangle. Overall, as long as the hard mask 402 is designed to have the specific shape, including the tilt sidewall 402S, the bottom plane 402B, and the acute angle θ formed there in between, it can be feasible for implementing the inventive purpose of the present invention. For people who are skilled in the art and with ordinary knowledge in the field, modifications without departing from the spirit of the present invention are permitted. However, within the scope of its equality, it is believed that such modifications should still fall into the scope and claims of the present invention.

In specific, the formed acute angle θ, preferably, is between 30 degrees and 85 degrees. And then, as illustrated in step S424, a body ion implantation process is subsequently performed. Please refer to FIG. 3D at the same time. The body ion implantation process PI is performed, such that at least one body region 55 is formed between adjacent two hard masks 402 in the semiconductor substrate layer. Each of the body regions 55 has an upper surface and a lower surface, and a width of the upper surface W1 is greater than that of the lower surface W2, indicating that W1>W2.

According to the embodiment of the present invention, such body ion implantation process PI can be performed by using ions such as boron (B), aluminum (Al), phosphorus (P), or nitrogen (N). For instance, a boron or aluminum ion implantation can be used to form an N-channel VDMOSFET. On the other hand, a phosphorus or nitrogen ion implantation can be used to form a P-channel VDMOSFET. An ion implantation dose of the body ion implantation process PI can be, for example, between $10^{12}$ cm$^{-2}$ and $10^{14}$ cm$^{-2}$. An ion implantation energy of the body ion implantation process PI can be, for example, between 10 keV and 2 MeV. In general, according to the proposed process techniques of the present invention, the ions used in the body ion implantation process, including the ion species, implantation energies, implantation dosages, as well as parameters such as temperature and time for performing the process, are allowed to be adjustable. The present invention is certainly not limited thereto the foregoing conditions. And accordingly, it is believed that the present invention is characterized by great process flexibility.

What draws our attention is that according to the embodiment of the present invention, since the body ion implantation process PI is basically performed based on the outline shape of the hard mask 402, it is evident that between the upper surface and the lower surface of the body region 55 is a connecting sidewall 55S to be formed, and a slope of the connecting sidewall 55S is consistent with a slope of the tilt sidewall 402S of the hard mask 402.

Under such a condition, it can be expected that a parasitic JFET region 60 will be formed in the semiconductor substrate layer of the high power device between two of the adjacent body regions 55. The parasitic JFET region 60 has an upper width W3 and a lower width W4 relative to its two adjacent body regions 55, and the lower width W4 is greater than the upper width W3. As a result, it can be observed that the present invention achieves in controlling an outline shape of the parasitic JFET region 60 to have a wider bottom and a narrower top (W4>W3), such that its JFET effect is reduced and parasitic resistance thereof can be lowered significantly. The applicants of the present invention will also provide relevant simulation data and analyses along with the data verification, so as to prove the efficacy of the disclosed invention, which will be described in details in the following paragraphs later on.

Figure 3E:
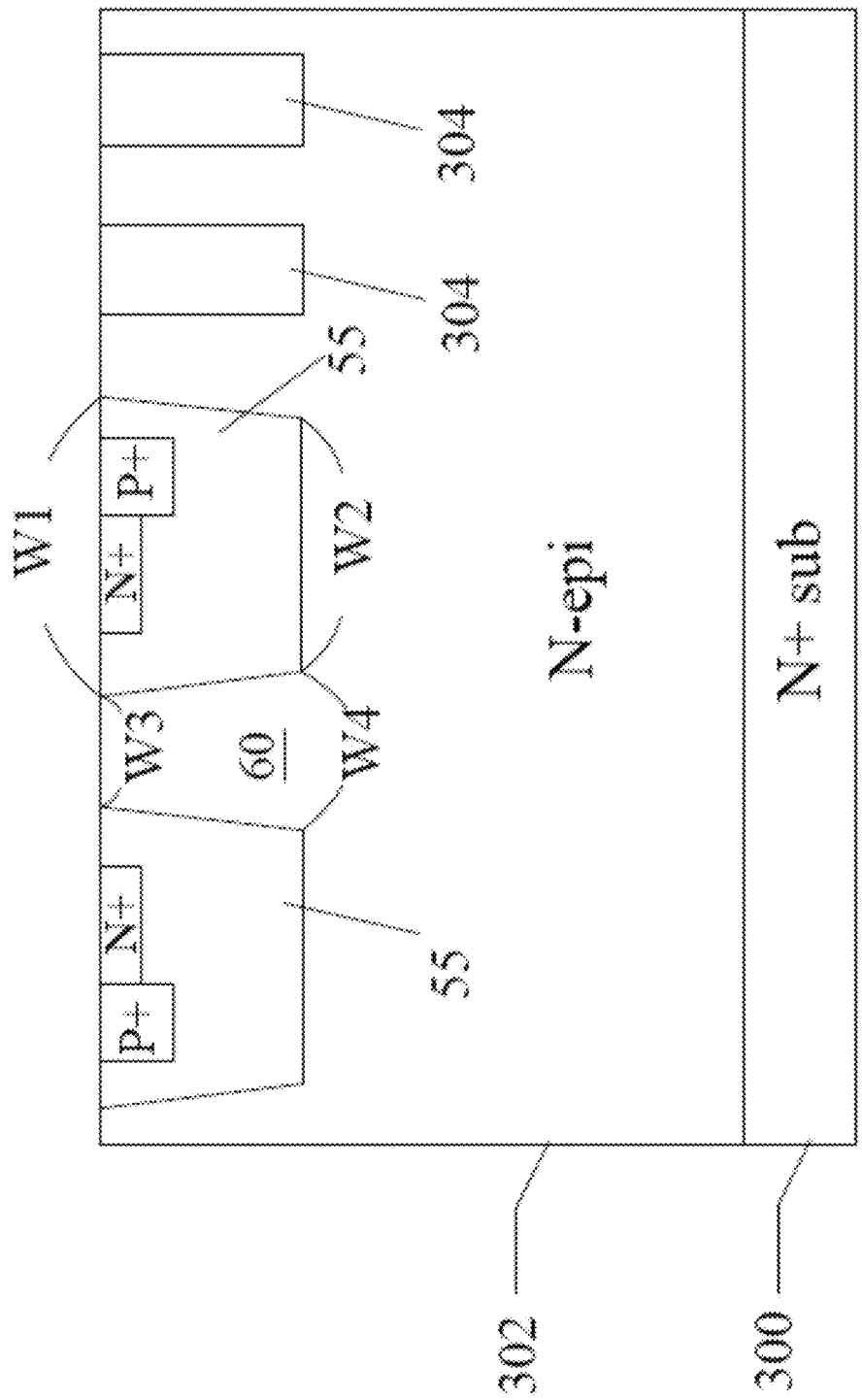
FIG. 3E shows a schematic structural diagram from FIG. 3D after the plurality of hard masks are removed.
Figure 3F:
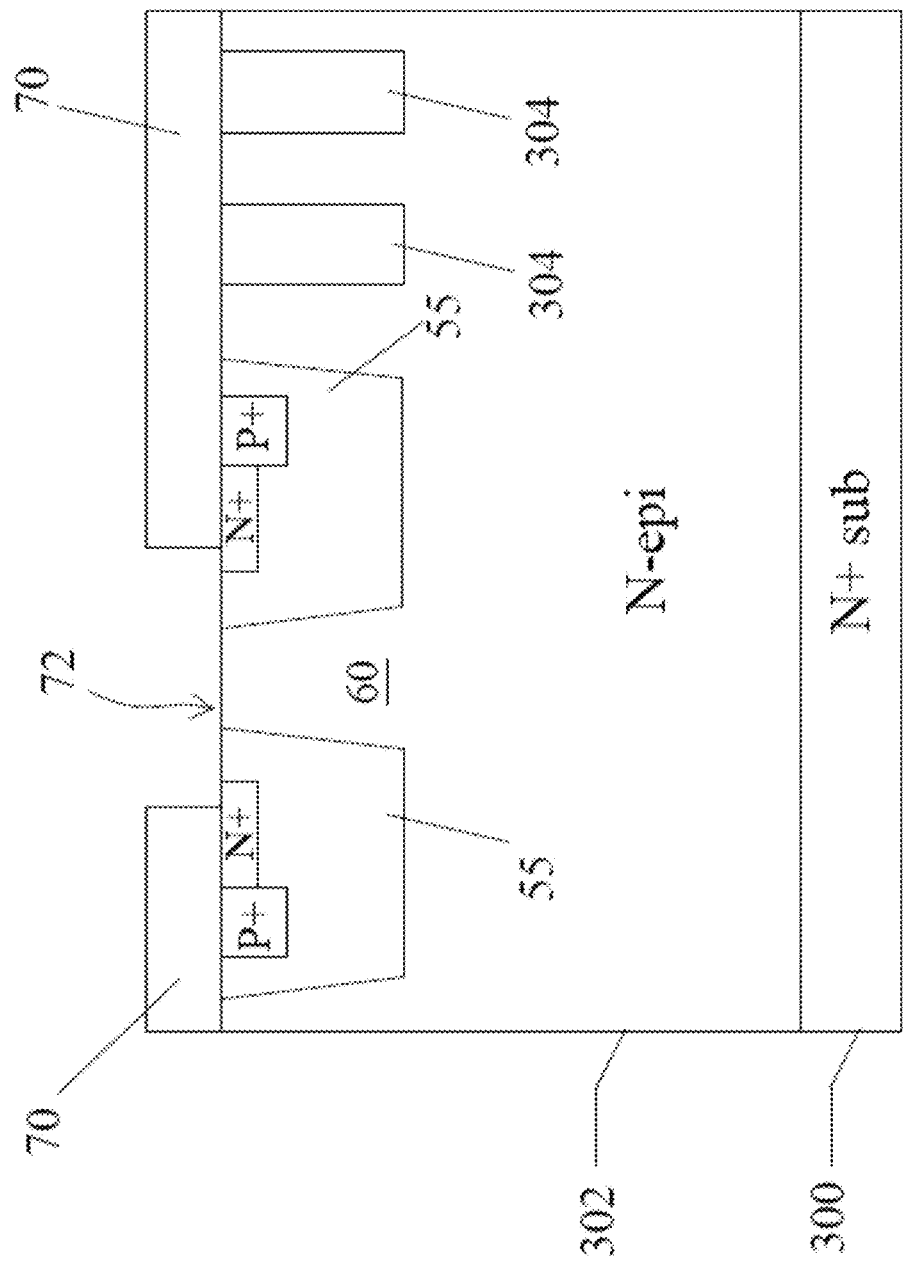
FIG. 3F shows a schematic structural diagram from FIG. 3E after a field oxide layer is grown.

Please proceed to FIG. 3E, in which the plurality of hard masks 402 are removed and in FIG. 3F, a chemical vapor deposition (CVD) process is then employed to deposit silicon dioxide as a field oxide layer 70 and a lithography process is then applied to the field oxide layer 70 to define a gate region 72. After that, please refer to FIG. 3G, in which a gate oxide layer 74 is formed in the gate region 72. According to the embodiment of the present invention, the gate oxide layer 74 can be formed by employing either a thermal oxidation process or a chemical vapor deposition process. Later, a gate conductive layer 80 is then formed on the gate oxide layer 74 as shown in FIG. 3H. In one preferable embodiment of the present invention, a low-pressure chemical vapor deposition (LPCVD) process is usually firstly used to deposit polysilicon as a gate material in the current manufacturing process. After that, an etch back process is employed to etch back the polysilicon, so as to form the structure of the gate conductive layer 80 as shown in FIG. 3H.

Figure 3G:
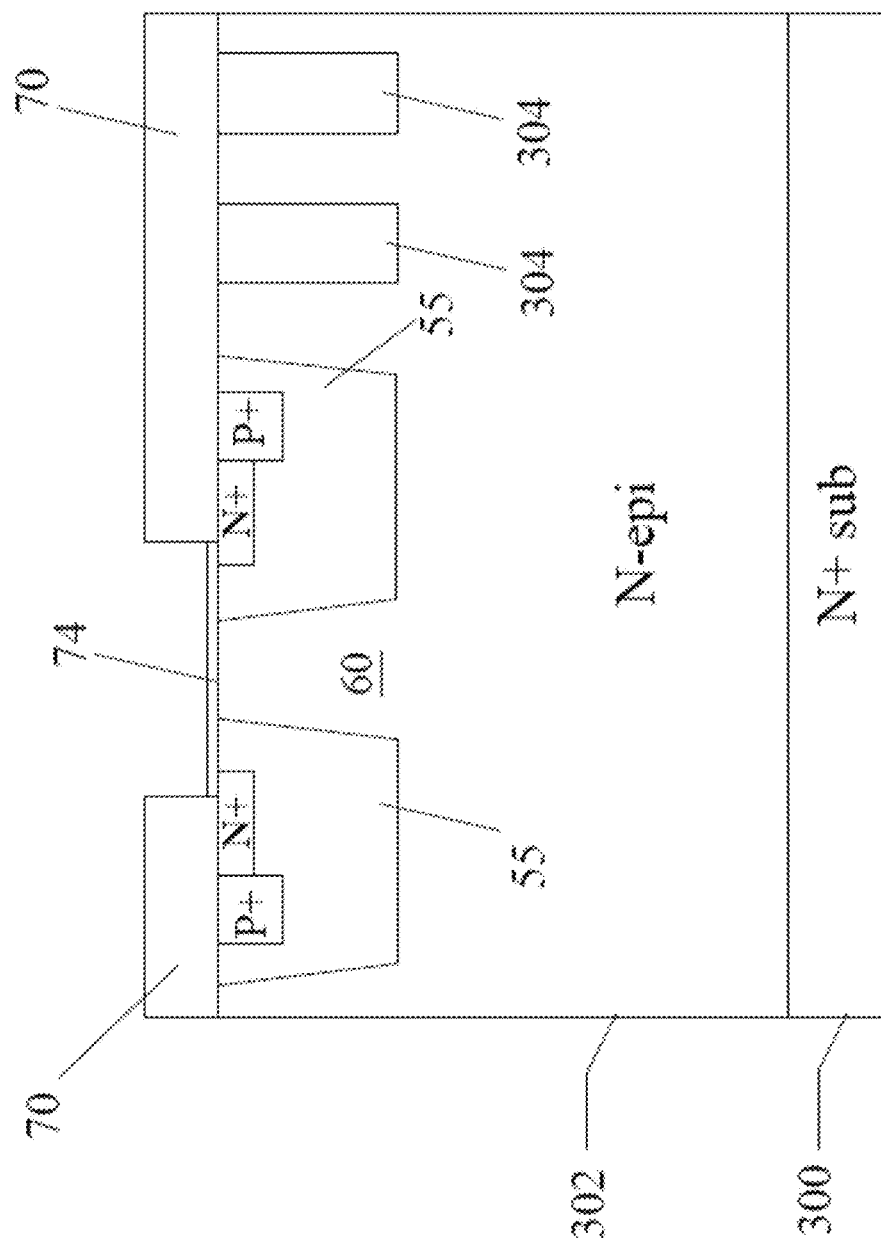
FIG. 3G shows a schematic structural diagram from FIG. 3F, in which a gate oxide layer is formed.
Figure 3H:
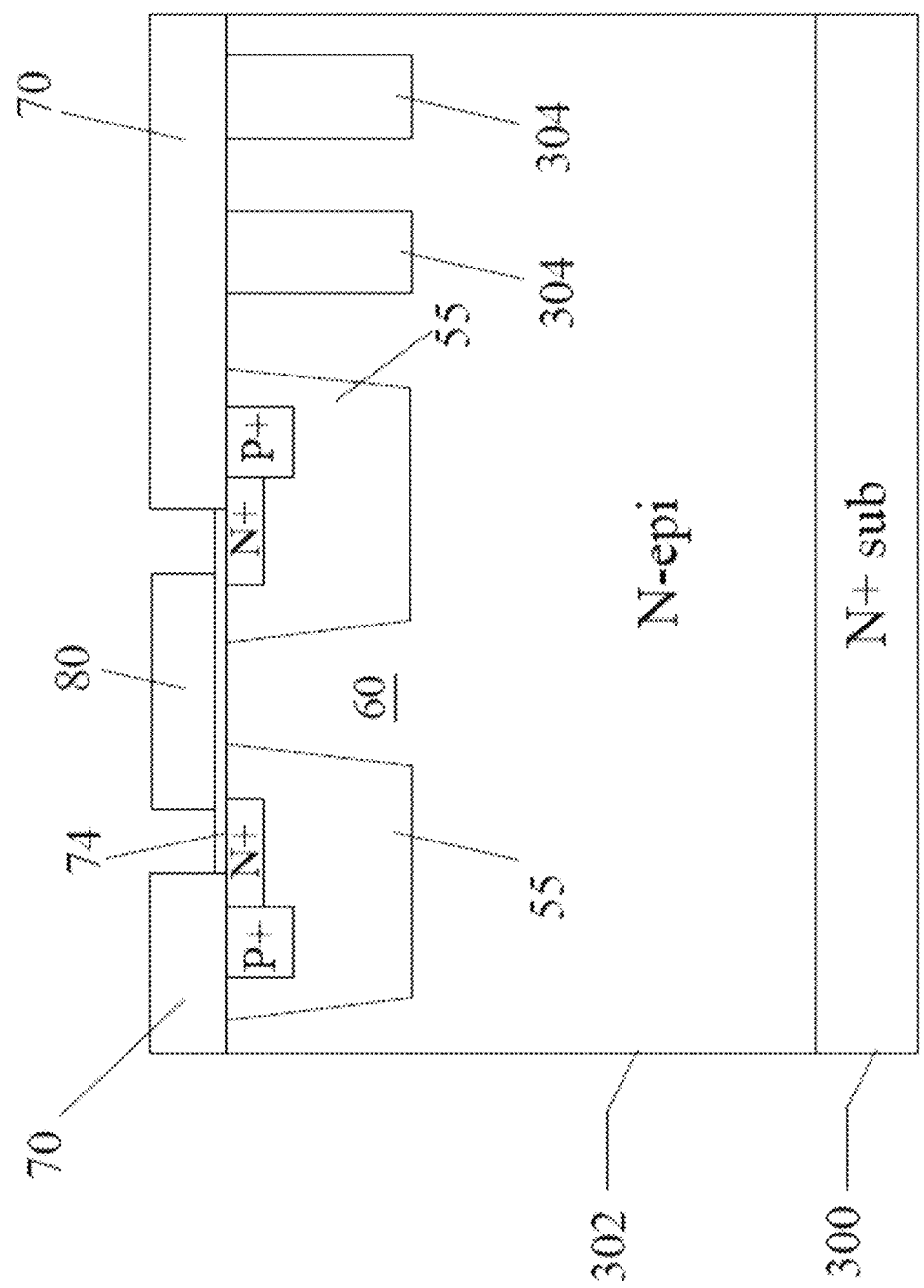
FIG. 3H shows a schematic structural diagram from FIG. 3G, in which a gate conductive layer is further formed on the gate oxide layer.
Figure 3I:
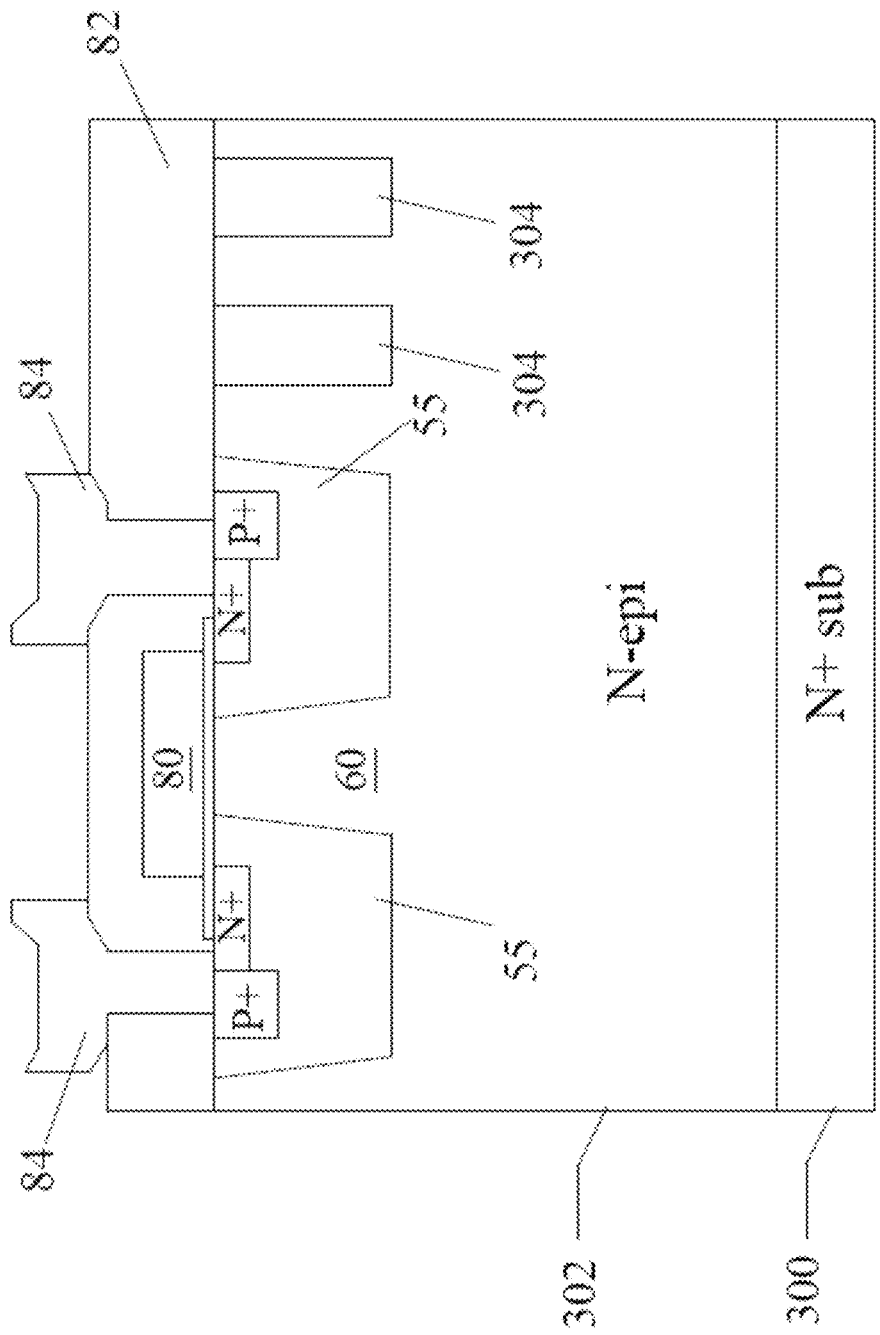
FIG. 3I shows a schematic structural diagram from FIG. 3H, in which a dielectric layer is further deposited and at least one contact window is formed to complete the transistor fabrication.

And then, as shown in FIG. 3I, a dielectric layer 82 is further deposited on the gate conductive layer 80. Finally, at least one contact window 84 is formed and followed by a plurality of process steps including contact window etching, metal deposition, metal etching, etc., wherein the contact windows 84 extend through the dielectric layer 82, and electrically connected to the semiconductor substrate layer of the high power device for providing electrical paths. On the other hand, from another perspective view (not seen in this figure), the polysilicon gate will also need to have alleged metal contacts. Nevertheless, since the configurations are not seen from the cross section of this perspective view in such figure, and those skilled in the art should be able to implement based on various requirements, redundant descriptions are disregarded herein.

General speaking, considering the post end process steps from FIG. 3F to FIG. 3I including: growing a field oxide layer 70 (as shown in FIG. 3F), using a thermal oxidation process or a chemical vapor deposition process to form the gate oxide layer 74 (as shown in FIG. 3G), performing gate deposition to form the gate conductive layer 80 (as shown in FIG. 3H), performing dielectric layer deposition, contact window etching, metal deposition, and metal etching (as shown in FIG. 3I), since these steps are mostly the same as they are in a conventional VDMOSFET manufacturing process and the fabrication device is shown in FIG. 3I, the present invention is thus not intended to go deeper into details regarding the post end process flows.

What is important lies in, the inventive spirits of the present invention focus on providing an ion implantation hard mask having tilt sidewalls, such that a semiconductor body region having a tilt edge can be formed. Therefore, a parasitic junction field effect transistor region having a wider bottom and a narrower top can be accordingly obtained. By such technical features, the conventional parasitic junction field effect transistor effect is reduced. In addition, since a bottom angle of the body region is increased due to the specific shape of the body region having the tilt edge, breakdown voltages of the high power device it is applied to, can be effectively increased as well.

Figure 5:
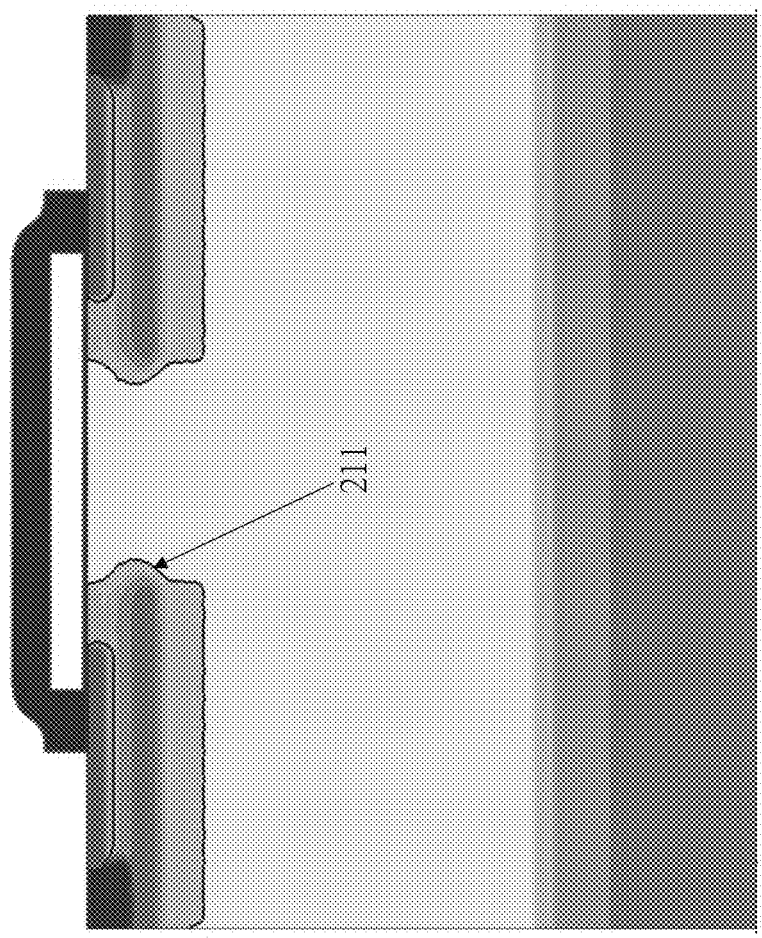
FIG. 5 shows a schematic structural diagram of a conventional VDMOSFET in which its body region has a protruding edge.
Figure 6:
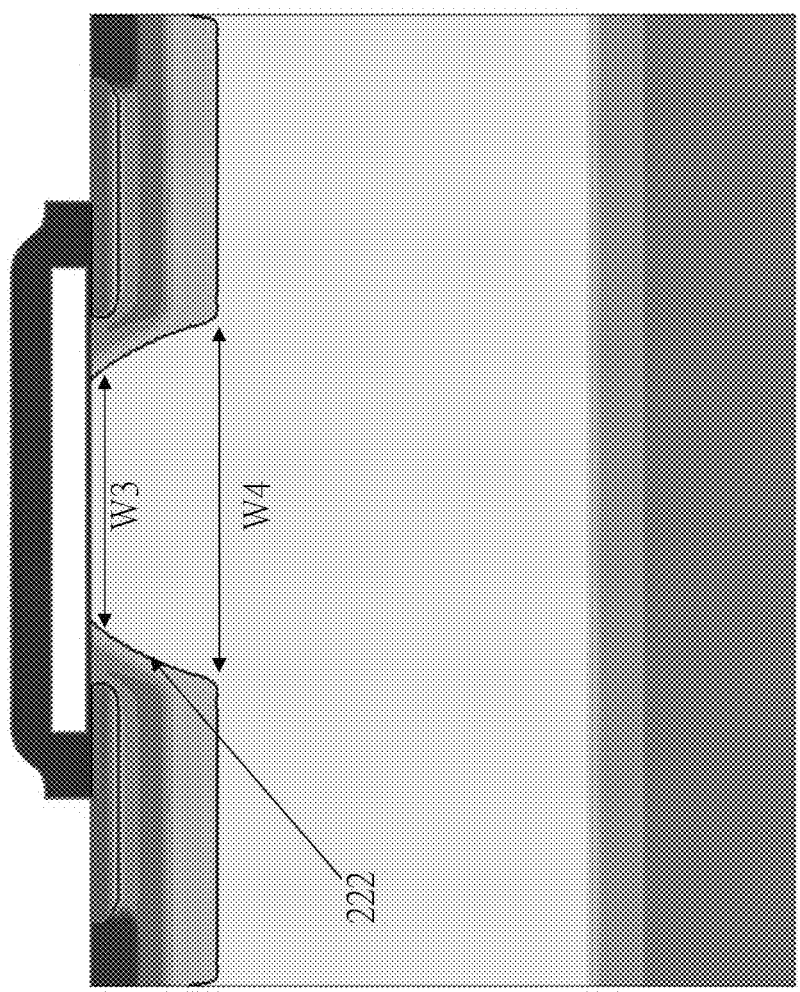
FIG. 6 shows a schematic structural diagram of a novel VDMOSFET in which its body region has a tilt edge formed by employing the disclosed method of the present invention.
Figure 7:
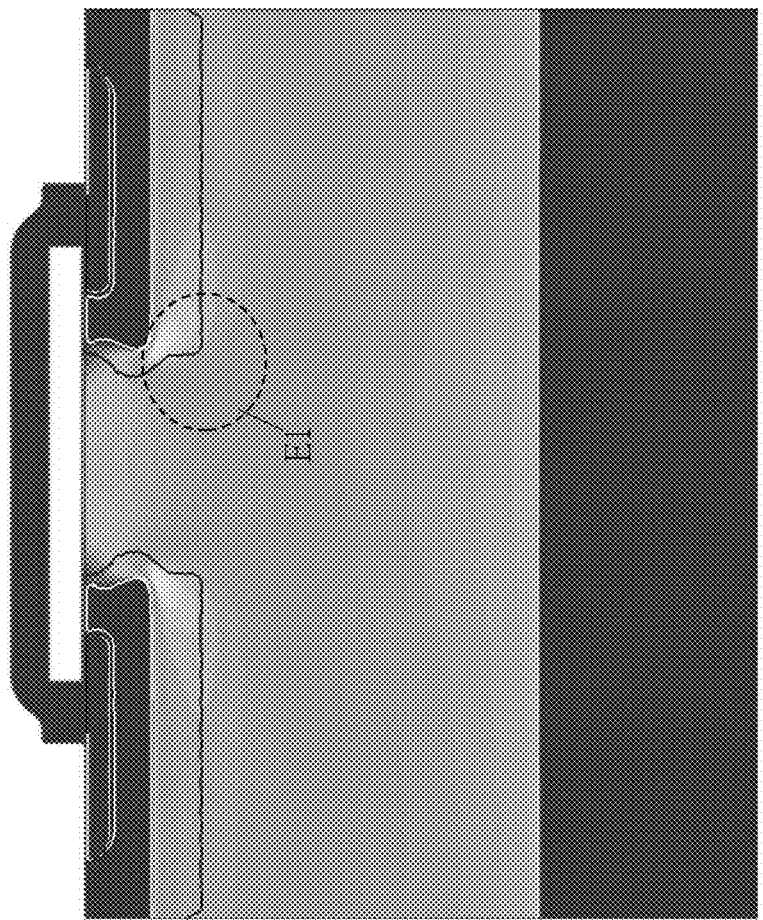
FIG. 7 shows a schematic diagram of the electric field distribution according to the conventional structure in FIG. 5.
Figure 8:
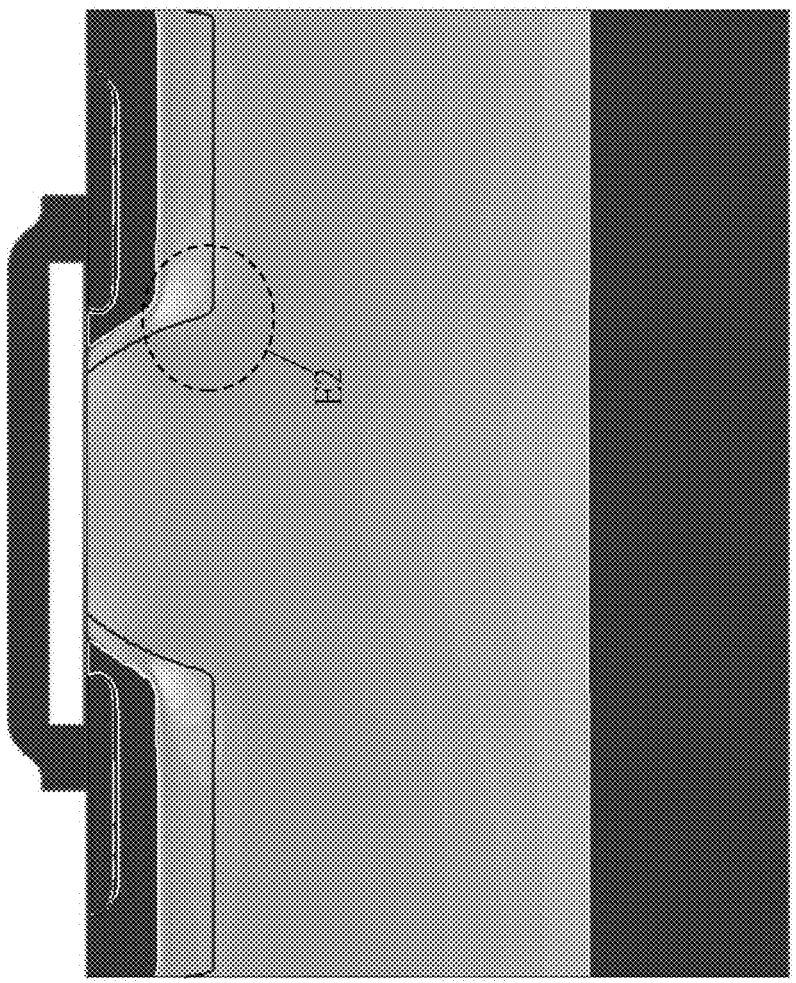
FIG. 8 shows a schematic diagram of the electric field distribution according to the novel structure of the present invention in FIG. 6.
Figure 9:
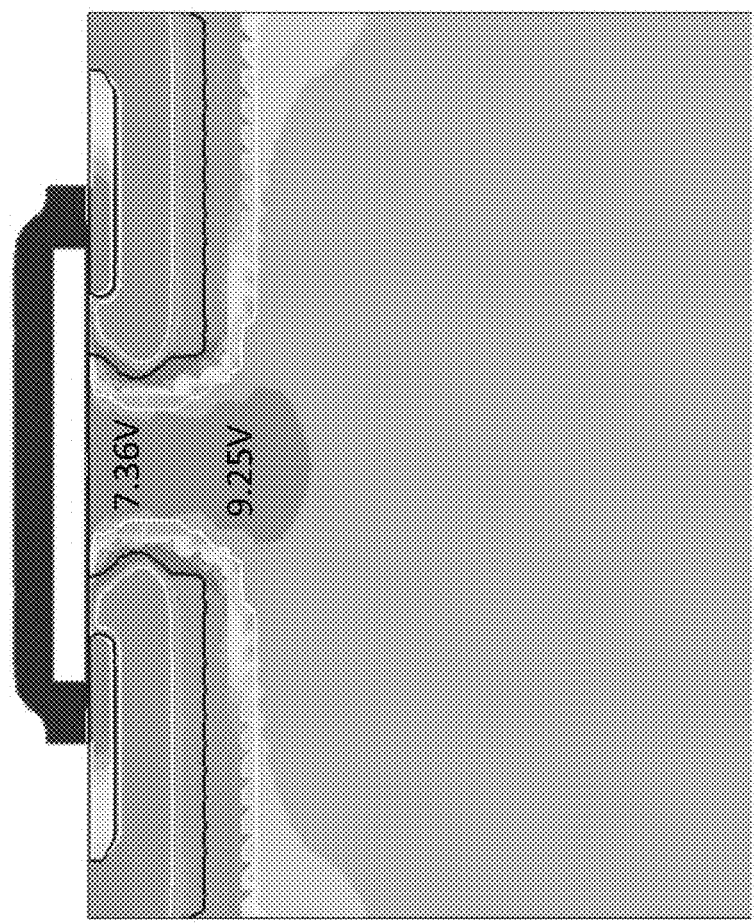
FIG. 9 shows a schematic diagram of the current density distribution according to the conventional structure in FIG. 5 when Vgs=20V and Vds=10V.
Figure 10:
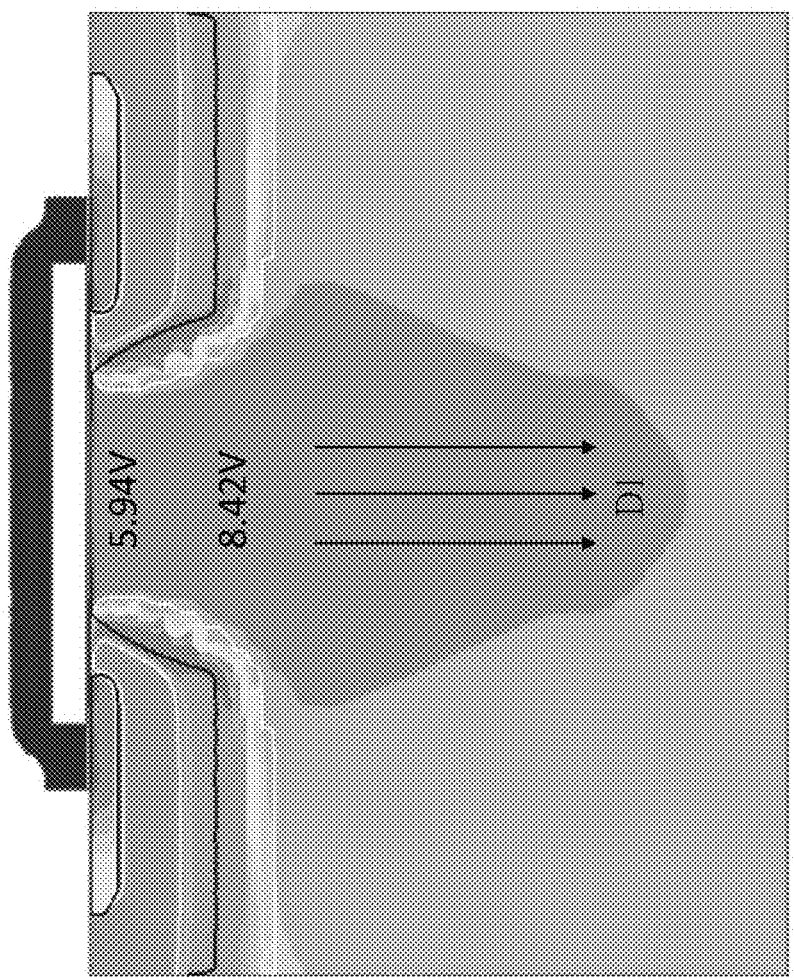
FIG. 10 shows a schematic diagram of the current density distribution according to the novel structure of the present invention in FIG. 6 when Vgs=20V and Vds=10V.

In the following descriptions, please further refer to FIG. 5 and FIG. 6, wherein FIG. 5 shows a schematic structural diagram of a conventional VDMOSFET in which its body region has a protruding edge 211, and the sidewalls of its hard mask which has been applied is vertical (90 degrees). On the other hand, FIG. 6 shows a schematic structural diagram of a novel VDMOSFET in which its body region has a tilt edge 222 formed by employing the ion implantation hard mask having tilt sidewalls of the present invention. As can be seen from FIG. 6, it is ensured that by adopting the process method disclosed in the present invention, the parasitic junction field effect transistor region to be formed indeed has a wider bottom and a narrower top, showing that W4>W3. As a result, the parasitic junction field effect transistor effect is suppressed. Moreover, FIG. 7 shows a schematic diagram of the electric field distribution according to the conventional structure in FIG. 5. FIG. 8 shows a schematic diagram of the electric field distribution according to the novel structure of the present invention in FIG. 6. From these two figures, it is obtained that the electric field intensity of the region E1 at the bottom of the body region in the prior art is about 2.47 MV/cm. On the contrary, when the disclosed process method of the present invention is applied, the electric field intensity of the region E2 at the bottom of the body region as shown in FIG. 8, can be effectively reduced to 2.36 MV/cm. And furthermore, please refer to FIG. 9 and FIG. 10, wherein FIG. 9 shows a schematic diagram of the current density distribution according to the conventional structure in FIG. 5 when Vgs=20V and Vds=10V. FIG. 10 shows a schematic diagram of the current density distribution according to the novel structure of the present invention in FIG. 6 when Vgs=20V and Vds=10V. Applicants of the present invention use simulation tools to calculate and retrieve that the parasitic junction field effect transistor resistance $R_{JFET}$ in FIG. 9 equals to $(9.25V-7.36V)/(1.39*10^{-4}$ A$)=13697\Omega$. Compared to FIG. 9, the parasitic junction field effect transistor resistance $R_{JFET}$ in FIG. 10 equals to $(8.42V-5.94V)/(3.95*10^{-4}$ A$)=6278\Omega$. As a result, it is obvious that the parasitic JFET resistance is greatly reduced, and the parasitic JFET effect is effectively improved. Besides, as shown in FIG. 10, the current density is distributed along the direction D1, showing a significant gain.

As such, in view of the above-mentioned data and analyses conclusions of these simulation results, it can be obvious that through the process method disclosed in the present invention, the resistance of the parasitic junction field effect transistor is indeed effectively reduced, and at the same time, the breakdown voltage of the device is accordingly increased. As a result, when compared with the existing methodologies, the present invention is advantageous of having excellent inventive efficacy.

Therefore, it is guaranteed that the present invention proposes an extremely novel and inventive process technique, which is aimed to form a semiconductor body region having a tilt edge by adopting at least one ion implantation hard mask having tilt sidewalls, such that a parasitic JFET region characterized by having a wider bottom and a narrower top can be accordingly formed. And due to the specific outline shape of the parasitic JFET region, the conventional parasitic JFET effect is suppressed. The process method disclosed in the present invention is advantageous of having low process complexity without increasing the process cost. In addition, it avoids the drawbacks of decrease in breakdown voltages and increase in output capacitances when the dopant concentration in the JFET region must be increased in the prior art.

In yet another aspect, by employing the process method of the present invention, since a semiconductor body region having a tilt edge connected between its wider top and narrower bottom is formed, its bottom angle of the body region is increased at the same time. Thereby, breakdown voltage of the device is increased as well. Apart from the above, it is effective that the proposed method for reducing parasitic junction field effect transistor resistance disclosed by the present invention, can be compatible with the current existing technologies, such as the current spreading layer (CSL) under the body region. Technically, the present invention is believed to be characterized by having extremely high compatibility and filled with innovative and practical values.

As a result, to sum up, it is apparent that according to the process method and variant embodiments disclosed in the present invention, the shortcomings existing in the prior arts are effectively solved. Moreover, the proposed process method of the present invention can be applied to not only silicon carbide substrate, but also to various substrates which are made of wide bandgap materials. Also, the disclosed process method of the present invention can be applicable to not only a general VDMOSFET structure, but also any other semiconductor device having the VDMOSFET structure, for example, an IGBT. In view of all, the present invention is characterized by having superior process flexibility and is certainly not limited to the parameters and/or conditions disclosed herein. The Applicants assert that the present invention is instinct, effective and highly competitive for incoming technologies, industries and researches developed in the future. And since the technical features, means and effects achieved by the present invention are significantly different from the current solutions and can not be accomplished easily by those who are familiar with the industry, it is thus believed that the present invention is indeed characterized by patentability and shall be patentable soon in a near future.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A method for reducing parasitic junction field effect transistor resistance, which is applicable to a high power device including a semiconductor substrate layer, the method comprising:
   providing a plurality of hard masks on a top surface of the semiconductor substrate layer, wherein each of the plurality of hard masks includes a bottom plane and a tilt sidewall, and an acute angle is formed between the tilt sidewall and the bottom plane; and
   performing a body ion implantation process, such that at least one body region is formed between adjacent two of the plurality of hard masks in the semiconductor substrate layer, the at least one body region has an upper surface and a lower surface, and a width of the upper surface is greater than that of the lower surface, wherein between the upper surface and the lower surface of the body region is a connecting sidewall, both the connecting sidewall of the body region and the tilt sidewall of the hard mask have a sloped sidewall, and a slope of the connecting sidewall of the body region is the same as the slope of the tilt sidewall of the hard mask.

2. The method according to claim 1, wherein when there are at least two of the body regions formed in the semiconductor substrate layer, a parasitic junction field effect transistor region is formed between two of the body regions, the parasitic junction field effect transistor region has an upper width and a lower width, and the lower width is greater than the upper width.

3. The method according to claim 1, wherein the plurality of hard masks are formed by applying a lithography process to a barrier layer, and the barrier layer is made of silicon dioxide, silicon nitride, or polysilicon.

4. The method according to claim 3, wherein a thickness of the barrier layer is between 0.5 µm and 3 µm.

5. The method according to claim 1, wherein the acute angle is between 30 degrees and 85 degrees.

6. The method according to claim 1, wherein the body ion implantation process is performed by using ions such as boron (B), aluminum (Al), phosphorus (P), or nitrogen (N).

7. The method according to claim 1, wherein an ion implantation dose of the body ion implantation process is between 1012 cm-2 and 1014 cm-2.

8. The method according to claim 1, wherein an ion implantation energy of the body ion implantation process is between 10 keV and 2 MeV.

9. The method according to claim 1, wherein one of the plurality of hard masks is formed as a trapezoid or a triangle.

10. The method according to claim 1, after the body region is formed, further comprising:
    removing the plurality of hard masks, and growing a field oxide layer;
    applying a lithography process to the field oxide layer to define a gate region;
    forming a gate oxide layer in the gate region;
    forming a gate conductive layer on the gate oxide layer and further depositing a dielectric layer on the gate conductive layer; and
    forming at least one contact window which extends through the dielectric layer, and electrically connected to the semiconductor substrate layer of the high power device for providing electrical paths.

11. The method according to claim 10, wherein in the step of forming the gate conductive layer, further comprising:
    using a low-pressure chemical vapor deposition (LPCVD) process to deposit a polysilicon; and
    using an etch back process to etch back the polysilicon, so as to form the gate conductive layer.

12. The method according to claim 1, wherein the semiconductor substrate layer of the high power device is made of a semiconductor material, such as silicon (Si), silicon carbide (SiC), gallium oxide ($Ga_2O_3$), aluminum nitride (AlN), or diamond.

13. The method according to claim 1, wherein the high power device is a Vertical Double Diffused Metal Oxide Semiconductor Field Effect Transistor (VDMOSFET), or an Insulated Gate Bipolar Transistor (IGBT).

14. The method according to claim 1, wherein the semiconductor substrate layer of the high power device comprises an N-type semiconductor substrate, an N-type epitaxial layer, a first N-type heavily doped region, a second N-type heavily doped region, a first P-type heavily doped region, a second P-type heavily doped region, and at least one floating guard ring, the N-type epitaxial layer is disposed on the N-type semiconductor substrate, the first P-type heavily doped region is disposed adjacent to the first N-type heavily doped region, and the first P-type heavily doped region and the first N-type heavily doped region are commonly disposed in the N-type epitaxial layer, the second P-type heavily doped region is disposed adjacent to the second N-type heavily doped region, and the second P-type heavily doped region and the second N-type heavily doped region are commonly disposed in the N-type epitaxial layer, the at least one floating guard ring is formed at a termination outside the first P-type heavily doped region or the second P-type heavily doped region.

15. The method according to claim 14, wherein the first N-type heavily doped region and the second N-type heavily doped region are formed by using a source ion implantation in the N-type epitaxial layer.

16. The method according to claim 14, wherein the N-type semiconductor substrate is an N-type silicon carbide (SiC) substrate.

\* \* \* \* \*